United States Patent
Hwang

(10) Patent No.: US 11,923,014 B2
(45) Date of Patent: Mar. 5, 2024

(54) MEMORY SYSTEM COMPENSATING FOR PERFORMANCE DETERIORATION OF A MEMORY DEVICE

(71) Applicant: SK hynix Inc., Gyeonggi-do (KR)

(72) Inventor: Ji Hoon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 80 days.

(21) Appl. No.: 17/492,814

(22) Filed: Oct. 4, 2021

(65) Prior Publication Data

US 2022/0319610 A1    Oct. 6, 2022

(30) Foreign Application Priority Data

Apr. 6, 2021  (KR) .................. 10-2021-0044875

(51) Int. Cl.
| | |
|---|---|
| *G11C 16/16* | (2006.01) |
| *G11C 16/10* | (2006.01) |
| *G11C 16/26* | (2006.01) |
| *G11C 16/30* | (2006.01) |

(52) U.S. Cl.
CPC ............ *G11C 16/16* (2013.01); *G11C 16/102* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 8,356,152 B2 * | 1/2013 | You ...................... | G11C 16/349 711/173 |
| 9,418,000 B2 * | 8/2016 | Raghunathan ......... | G11C 16/26 |
| 10,776,007 B2 * | 9/2020 | Kunimatsu ........... | G06F 3/0679 |
| 10,915,252 B2 * | 2/2021 | Li ......................... | G06F 3/0616 |
| 2020/0210309 A1 * | 7/2020 | Jung ................... | G06F 11/3476 |

FOREIGN PATENT DOCUMENTS

| | | |
|---|---|---|
| KR | 1020170097614 A | 8/2017 |
| KR | 1020200084201 A | 7/2020 |

* cited by examiner

*Primary Examiner* — Kretelia Graham
(74) *Attorney, Agent, or Firm* — IP & T GROUP LLP

(57) ABSTRACT

A memory controller that controls a memory device may include a model manager configured to obtain log information on use of the memory device for a predetermined period, and generate a regression model that predicts a lifespan of the memory device based on the log information, and a performance manager configured to determine a deterioration section in which performance of the memory device is deteriorated based on the regression model, and adjust a parameter value related to an operation of the memory device in the deterioration section.

17 Claims, 11 Drawing Sheets

FIG. 4

| S.M.A.R.T Information | | |
|---|---|---|
| POH | HOST Write [GB] | E/W |
| 1 | 256 | 1 |
| 20 | 512 | 2 |
| 40 | 1280 | 5 |
| 50 | 1536 | 6 |
| 60 | 2304 | 9 |
| 80 | 2560 | 10 |
| 120 | 3328 | 13 |
| 130 | 3584 | 14 |
| 170 | 4864 | 19 |
| 200 | 5632 | 22 |
| 230 | 6400 | 25 |
| 260 | 7168 | 28 |
| 290 | 8192 | 32 |
| 320 | 8960 | 35 |
| 350 | 9216 | 36 |
| 380 | 11264 | 44 |
| 410 | 12544 | 49 |
| 440 | 13056 | 51 |
| 470 | 15360 | 60 |
| 500 | 17920 | 70 |

MEMORY SYSTEM COMPENSATING FOR PERFORMANCE DETERIORATION OF A MEMORY DEVICE

CROSS-REFERENCE TO RELATED APPLICATION

The present application claims priority under 35 U.S.C. § 119(a) to Korean patent application number 10-2021-0044875 filed on Apr. 6, 2021, the entire disclosure of which is incorporated by reference herein.

BACKGROUND

1. Field of Invention

The present disclosure relates to an electronic device, and more particularly, to a memory system and a method of operating the same.

2. Description of Related Art

A memory system is a device that stores data under control of a host device such as a computer or a smartphone. The storage device may include a memory device in which data is stored and a memory controller controlling the memory device. The memory device is classified into a volatile memory device and a nonvolatile memory device.

The volatile memory device is a device that stores data only when power is supplied and loses the stored data when the power supply is cut off. The volatile memory device includes for example a static random access memory (SRAM), a dynamic random access memory (DRAM), and the like.

The nonvolatile memory device is a device that does not lose data even though power is cut off. The nonvolatile memory device includes for example a read only memory (ROM), a programmable ROM (PROM), an electrically programmable ROM (EPROM), an electrically erasable and programmable ROM (EEPROM), a flash memory, and the like.

SUMMARY

One embodiment of the present disclosure provides a memory system and a method of operating the same which compensate for performance deterioration of a memory device.

According to one embodiment of the present disclosure, a memory controller that controls a memory device may include a model manager configured to obtain log information on use of the memory device for a predetermined period, and generate a regression model that predicts a lifespan of the memory device based on the log information, and a performance manager configured to determine a deterioration section in which performance of the memory device is deteriorated based on the regression model, and adjust a parameter value related to an operation of the memory device in the deterioration section.

According to another embodiment of the present disclosure, a memory system may include a memory device, and a memory controller that controls the memory device. The memory controller may include a model manager configured to generate a regression model that predicts performance of the memory device based on log information on use of the memory device, and a performance manager configured to determine a deterioration section in which the performance of the memory device is deteriorated based on the regression model, and adjust a parameter value related to an operation of the memory device in the deterioration section.

According to another embodiment of the present disclosure, a method of operating a memory controller that controls a memory device may include obtaining log information on use of the memory device for a predetermined period, generating a regression model that predicts a lifespan of the memory device based on the log information, determining a deterioration section in which performance of the memory device is deteriorated based on the regression model, and adjusting a parameter value related to an operation of the memory device in the deterioration section.

According to another embodiment of the present disclosure, an operating method of a managing device may comprise obtaining a linear regression relationship between an average erase count of memory blocks included in a target device and an accumulated power-on time amount of the target device, determining a section in terms of the power-on time amount, in which performance of the target device in terms of the average erase count is predicted to be deteriorated, based on the linear regression relationship and predetermined first and second thresholds of the average erase count and adjusting, while the power-on time amount is falling in the section, an operation parameter of the target device to compensate for the performance predicted to be deteriorated.

According to the present technology, a memory system and a method of operating the same which compensate for performance deterioration of a memory device may be provided.

BRIEF DESCRIPTION OF THE DRAWINGS

FIG. 4 is a table illustrating log information on use of a memory device according to another embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

Figure 1:
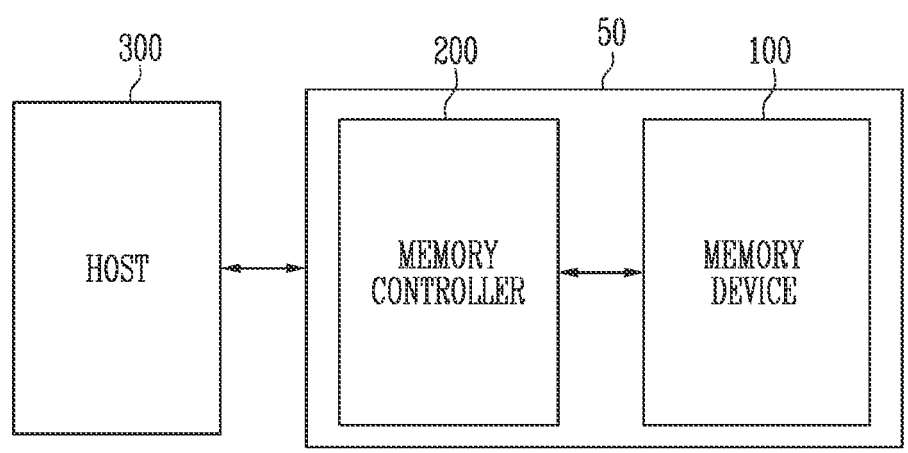
FIG. 1 is a diagram illustrating a memory system including a memory device according to one embodiment of the present disclosure.

FIG. 1 is a diagram illustrating a memory system 50 including a memory device according to one embodiment of the present disclosure.

Referring to FIG. 1, the memory system 50 may include a memory device 100 and a memory controller 200 that controls an operation of the memory device. The memory system 50 may be a device that stores data under control of a host 300 such as for example a cellular phone, a smartphone, an MP3 player, a laptop computer, a desktop computer, a game player, a TV, a tablet PC, or an in-vehicle infotainment system.

The memory system 50 may be manufactured as one of various types of storage devices according to a host interface that is a communication standards or interfaces with the host 300. For example, the memory system 50 may be configured as any one of various types of storage devices such as for example a solid state drive SSD, a multimedia card in a form of an MMC, an embedded eMMC, a reduced size RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, and a memory stick.

The memory system 50 may be manufactured as any one of various types of packages. The memory system 50 may be manufactured as any one of various types of package types, such as for example a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data.

At least one of the memory cells may be configured as a single level cell (SLC) that stores one data bit, a multi-level cell (MLC) that stores two data bits, a triple level cell (TLC) that stores three data bits, and/or a quad level cell (QLC) capable of storing four data bits.

The memory cell array may include a plurality of memory blocks. At least one memory block may include a plurality of memory cells. One memory block may include a plurality of pages. In one embodiment, the page may be a unit for storing data in the memory device 100 or reading data stored in the memory device 100. The memory block may be a unit for erasing data.

In one embodiment, the memory device 100 may be for example a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. The memory device 100 may perform an operation instructed by the command on the area selected by the address. For example, the memory device 100 may perform program, read, and erase operations. During the program operation, the memory device 100 may store data in the area selected by the address. In the present disclosure, an operation of storing data may be expressed as a program operation or a write operation. During the read operation, the memory device 100 may read data from the area selected by the address. During the erase operation, the memory device 100 may erase data stored in the area selected by the address.

In one embodiment, the memory device 100 may include a plurality of planes. The plane may be a unit capable of independently performing one or more operations. For example, the memory device 100 may include two, four, or eight planes. The plurality of planes may independently perform at least one or more of the program, read, or erase operations, simultaneously.

The memory controller 200 may control an overall operation of the memory system 50.

When power is applied to the memory system 50, the memory controller 200 may execute instructions such as for example firmware (FW). When the memory device 100 is a flash memory device, the firmware (FW) may include a host interface layer (HIL) that controls communication with the host 300, and the memory controller 200 may include a flash translation layer (FTL) that controls communication between the host 300 and the memory device 100, and a flash interface layer (FIL) that controls communication with the memory device 100.

The memory controller 200 may receive data to be stored and a logical block address (LBA) from the host 300 and may convert the LBA into a physical block address (PBA) indicating an address of memory cells in which data included in the memory device 100 is to be stored. In the present specification, the LBA and a "logic address" or a "logical address" may be used as the same meaning. In the present specification, the PBA and a "physical address" may be used as the same meaning.

The memory controller 200 may control the memory device 100 to perform one or more of the program, read, or erase operations, or the like according to a request of the host 300. During the program operation, the memory controller 200 may provide a program command, the PBA, and data to the memory device 100. During the read operation, the memory controller 200 may provide both a read command and the PBA to the memory device 100. During the erase operation, the memory controller 200 may provide both an erase command and the PBA to the memory device 100.

In one embodiment, the memory controller 200 may generate a command, an address, and data independent of a request from the host 300 and transmit the command, the address, and the data to the memory device 100. For example, the memory controller 200 may provide the command, the address, and the data for performing one or more of read and program operations accompanying the performing of wear leveling, read reclaim, garbage collection, and/or the like, to the memory device 100.

In another embodiment, the memory controller 200 may control at least two or more memory devices 100. In this embodiment, the memory controller 200 may control the memory devices 100 according to an interleaving method to improve operation performance. The interleaving method may be a method of controlling operations for at least two memory devices 100 to overlap with each other. Alternatively, the interleaving method may be a method in which at least two or more memory devices 100 operate in parallel.

A buffer memory may temporarily store data provided from the host 300, that is, data to be stored in the memory device 100, or may temporarily store data read from the memory device 100. In one embodiment, the buffer memory may be a volatile memory device. For example, the buffer memory may be a dynamic random access memory (DRAM) or a static random access memory (SRAM). In the present disclosure, the buffer memory may be used as the same meaning as a buffer.

The host 300 may communicate with the memory system 50 using at least one of various communication standards or interfaces such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
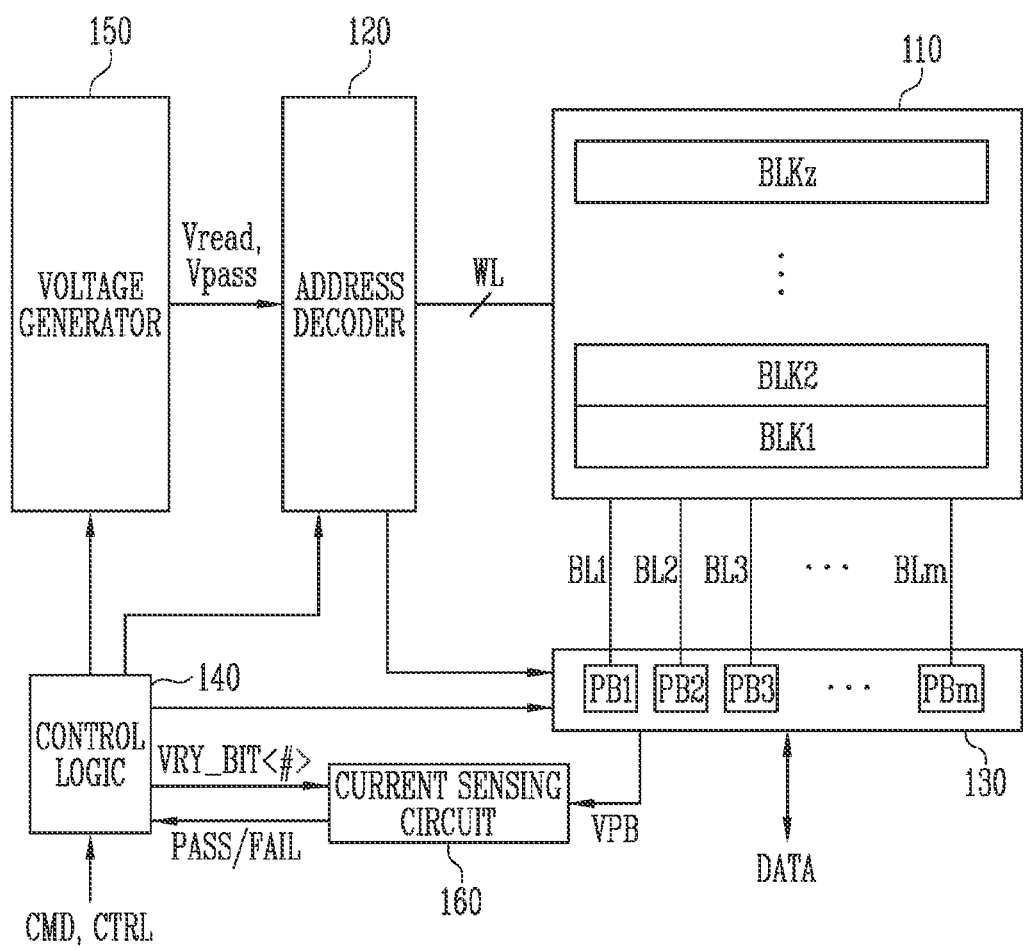
FIG. 2 is a diagram illustrating the memory device of FIG. 1.

FIG. 2 is a diagram illustrating the memory device 100 of FIG. 1.

Referring to FIG. 2, the memory device 100 includes a memory cell array 110, an address decoder 120, a read and write circuit 130, a control logic 140, a voltage generator 150, and a current sensing circuit 160. The address decoder 120, the read and write circuit 130, the voltage generator 150, and the current sensing circuit 160 may be referred to herein as a peripheral circuit controlled by the control logic 140.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In one embodiment, the plurality of memory cells are non-volatile memory cells, and may be configured as non-volatile memory cells having a vertical channel structure. The memory cell array 110 may be configured as a memory cell array of a two-dimensional structure. According to one embodiment, the memory cell array 110 may be configured as a memory cell array of a three-dimensional structure. Meanwhile, at least one of the plurality of memory cells included in the memory cell array may store at least one bit of data. In one embodiment, at least one of the plurality of memory cells included in the memory cell array 110 may be an SLC storing one bit of data. In another embodiment, at least one of the plurality of memory cells included in the memory cell array 110 may be an MLC storing two bits of data. In still another embodiment, at least one of the plurality of memory cells included in the memory cell array 110 may be a TLC storing three bits of data. In still another embodiment, at least one of the plurality of memory cells included in the memory cell array 110 may be a QLC storing four bits of data. According to another embodiment, the memory cell array 110 may include a plurality of memory cells storing five or more bits of data.

The address decoder 120 is connected to the memory cell array 110 through the word lines WL. The address decoder 120 is configured to operate in response to control of the control logic 140. The address decoder 120 receives an address through an input/output buffer inside the memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 may be configured to decode a column address of the received addresses. The address decoder 120 transmits the decoded column address to the read and write circuit 130.

In one embodiment, the read operation and the program operation of the memory device 100 are performed in a page unit. Addresses received at a time of a request of the read operation and the program operation may include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as a "physical page".

The read and write circuit 130 includes a plurality of page buffers PB1 to PBm. The read and write circuit 130 may operate as a "read circuit" during the read operation of the memory cell array 110 and may operate as a "write circuit" during the write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change in current as sensing data. The read and write circuit 130 operates in response to page buffer control signals output from the control logic 140. In the present specification, the write operation of the write circuit may be used as the same meaning as the program operation of storing data in the memory cells.

During the read operation, the read and write circuit 130 senses data of the memory cell, temporarily stores read data, and outputs data to the input/output buffer of the memory device 100. As one exemplary embodiment, the read and write circuit 130 may include a column select circuit, and the like, in addition to the page buffers (or page registers). The read and write circuit 130 may be a page buffer according to an embodiment of the present disclosure.

The control logic 140 is connected to the address decoder 120, the read and write circuit 130, the voltage generator 150, and the current sensing circuit 160. The control logic 140 receives a command CMD and a control signal CTRL through the input/output buffer of the memory device 100. The control logic 140 is configured to control overall operations of the memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

Meanwhile, the control logic 140 may determine whether a verify operation on a specific target program state is passed or failed in response to a pass signal PASS or a fail signal FAIL received from the current sensing circuit 160.

The voltage generator 150 may generate the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The current sensing circuit 160 may generate a reference current and a reference voltage in response to a permission bit VRY_BTI<#> received from the control logic 140 during a verify operation. A pass signal PASS or a fail signal FAIL may be output by comparing the generated reference voltage with a sensing voltage VPB received from the page buffers PB1 to PBm included in the read and write circuit 130 or comparing the generated reference current with a sensing current received from the page buffers PB1 to PBm included in the read and write circuit 130.

The address decoder 120, the read and write circuit 130, the voltage generator 150, and the current sensing circuit 160 may function as the "peripheral circuit" that performs the read, write, and erase operations on the memory cell array 110. The peripheral circuit performs the read, write, and erase operations on the memory cell array 110 based on the control of the control logic 140.

Figure 3:
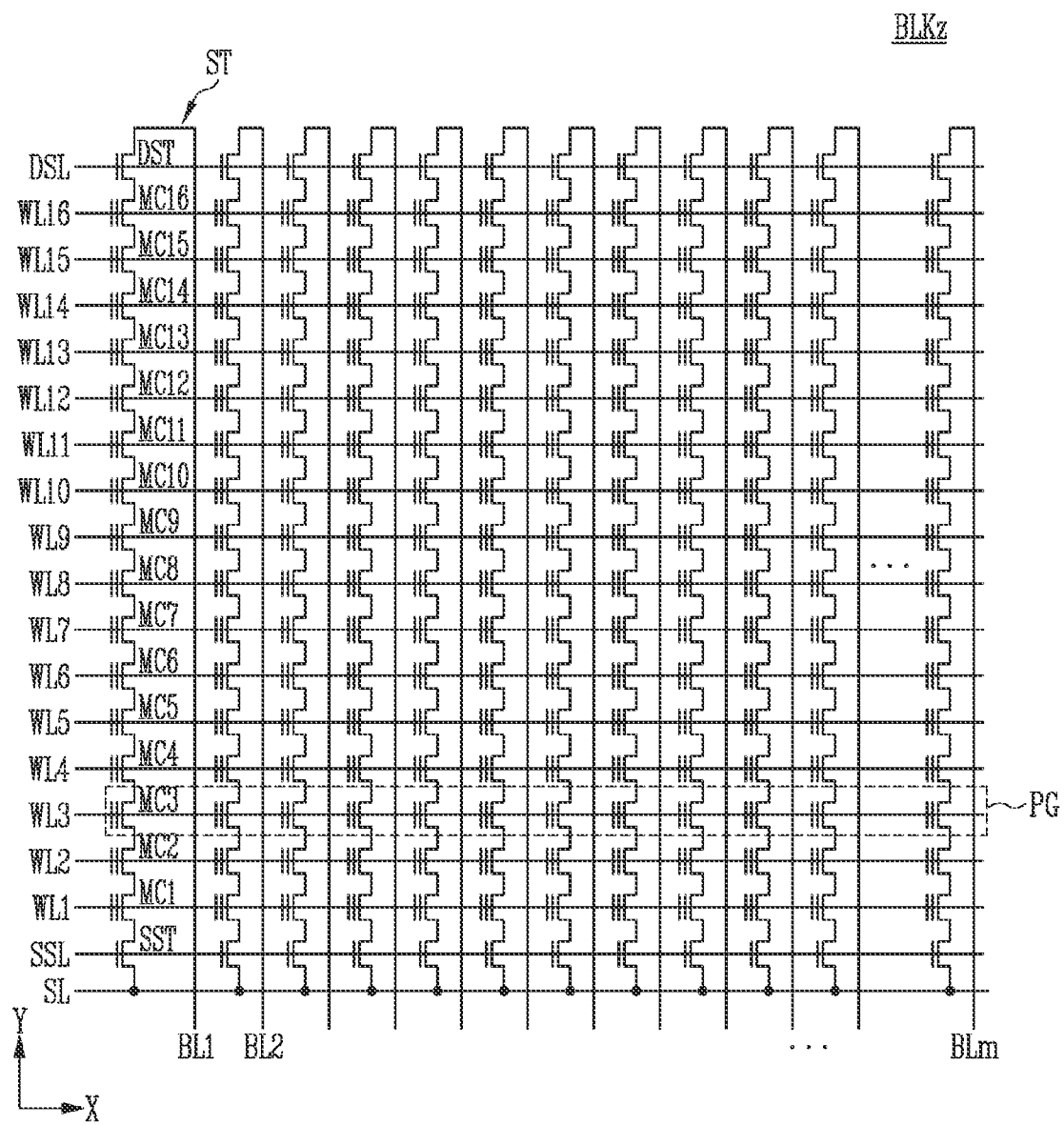
FIG. 3 is a diagram illustrating a configuration of any one of memory blocks of FIG. 2.

FIG. 3 is a diagram illustrating a configuration of any one of the memory blocks of FIG. 2.

The memory block BLKz is any one memory block BLKz among the memory blocks BLK1 to BLKz of FIG. 2.

Referring to FIG. 3, a plurality of word lines arranged in parallel with each other may be connected between a first select line and a second select line. Here, the first select line may be the source select line SSL, and the second select line may be the drain select line DSL. More specifically, the memory block BLKz may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured identically to each other, a string connected to the first bit line BL1 is specifically described as an example.

The string may include a source select transistor SST, a plurality of memory cells MC1 to MC16, and a drain select transistor DST connected in series between the source line SL and the first bit line BL1. One string may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKz may include the pages PG of the number of the word lines WL1 to WL16.

In one embodiment, one memory cell may store one bit of data. This is commonly called an SLC. In this case, one physical page PG may store one logical page (LPG) data. The one logical page (LPG) data may include data bits of the same number as cells included in one physical page PG.

In another embodiment, one memory cell may store two or more bits of data. In this case, one physical page PG may store two or more logical page (LPG) data.

FIG. 4 is a table illustrating log information on use of a memory device according to one embodiment of the present disclosure.

Referring to FIG. 4, the log information on the use of the memory device may be obtained. Data may be stored in the memory device or data stored in the memory device may be erased by a request of a user. A use pattern of the user may be reflected in the log information.

The log information on the use of the memory device may include information on a use time amount, a write amount, and an average erase number. The use time amount may mean an accumulated time amount for which power is applied to the memory device (that is, data in the power-on hour "POH" column are accumulated power-on time amounts). The write amount may mean an amount of data on which the write operation is performed in the memory device during the use time amount (that is, data in the "Host Write [GB]" column are write amounts). The average erase number may mean an average of the number of times the memory blocks included in the memory device are erased during the use time amount (that is, data in the "E/W" column are average erase numbers).

The log information on the use of the memory device may be obtained for one or more predetermined periods. For example, it may be assumed that log information on the use of the memory device is obtained once every three days at a predetermined time. In FIG. 4, log information in which the use time amount is 1 hour and the average erase number is 1 may be obtained in a first period. Log information in which the use time amount is 20 hours and the average erase number is 2 may be obtained in a second period. Log information in which the use time amount is 500 hours and the average erase number is 70 may be obtained in a twentieth period.

The log information on the use of memory device may be obtained through self-monitoring, analysis and reporting technology (S.M.A.R.T). The self-monitoring, analysis and reporting technology (S.M.A.R.T) may be a technology that diagnoses and reports a potential failure probability by examining reliability of a memory device. When failure is predicted by the self-monitoring, analysis and reporting technology (S.M.A.R.T), the user may replace the memory device to prevent loss of data from an unexpected problem.

In the table of FIG. 4, when the use time amount is 1 hour, the average erase number may be 1, and when the use time amount is 500 hours, the average erase number may be 70. This invention is not limited to the exact data shown in FIG. 4. For example, according to a use pattern of the user who uses the memory device, the average erase number may be different even though the use time amount is the same. According to the use pattern of the user, when a use time amount is 1 hour, the average erase number may be 3 or more, and when a use time amount is 500 hours, the average erase number may be 50 or less.

In another embodiment of the present disclosure, when the use time amount is 1 hour, the write amount may be 256 gigabytes. According to the use pattern of the user who uses the memory device, the write amount may be different even though the use time amount is the same.

The log information obtained through the self-monitoring, analysis and reporting technology (S.M.A.R.T) may be different according to the use pattern of different users who use the memory device.

Figure 5:
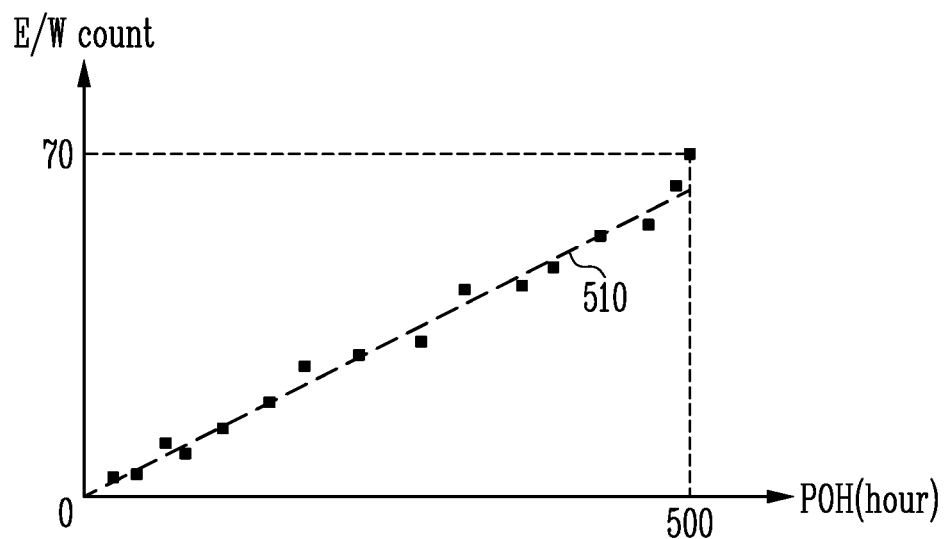
FIG. 5 is a diagram illustrating generation of a regression model according to one embodiment of the present disclosure.

FIG. 5 is a diagram illustrating generation of a regression model according to one embodiment of the present disclosure.

Referring to FIG. 5, the regression model 510 may be generated based on the information on the use time amount and the average erase number included in the log information on the use of the memory device obtained at each predetermined period.

The regression model 510 of FIG. 5 may be generated based on the information on the use time amount and the average erase number included in the log information of FIG. 4. For example, the regression model 510 may be generated based on the log information obtained until the use time amount reaches 500 hours. When for example 20 pieces of log information is obtained until the use time amount reaches 500 hours, an increment of the average erase number for the use time amount of each of the 20 pieces of log information may be obtained. The regression model 510 may be generated as a linear function having an average value of the obtained 20 increments as a slope thereof.

The regression model 510 may be used to calculate the average erase number of the memory device after the regression model 510 is generated. Specifically, the regression model 510 generated based on the average erase number of the memory device used by the user for 500 hours may be used for example to calculate the average erase number of the memory device when the use time amount reaches 1000 hours.

According to another embodiment of the present disclosure, the regression model may be generated based on the information on the use time amount and the write amount included in the log information on the use of the memory device. The write amount of the memory device after the regression model is generated may be predicted based on the generated regression model.

Figure 6:
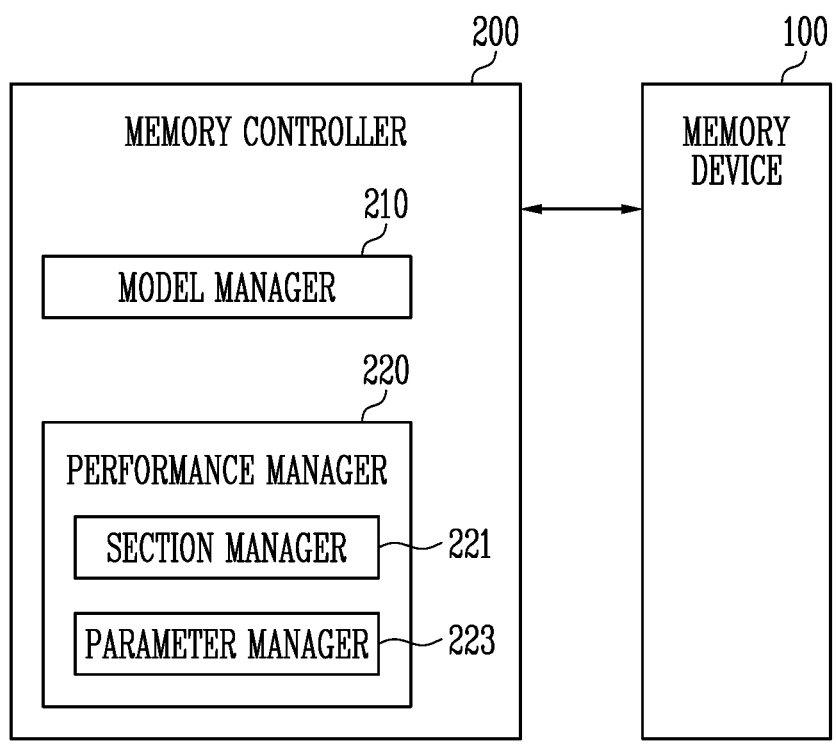
FIG. 6 is a block diagram illustrating a method of compensating for performance deterioration of a memory device according to another embodiment of the present disclosure.

FIG. 6 is a block diagram illustrating a method of compensating for performance deterioration of a memory device according to one embodiment of the present disclosure.

Referring to FIG. 6, the memory controller 200 may generate a regression model that predicts a lifespan or performance of the memory device 100 and may adjust a parameter value related to the operation of the memory device 100. The memory controller 200 may include a model manager 210 that generates the regression model that predicts the lifespan or the performance of the memory device 100 and a performance manager 220 that adjusts the parameter value(s) related to the operation of the memory device 100.

The model manager 210 may obtain the log information on the use of the memory device 100 for any predetermined period. The model manager 210 may generate the regression model that predicts the lifespan or the performance of the memory device 100 based on the log information. The log information on the use of the memory device 100 may include the use time amount indicating the accumulated time amount for which power is applied to the memory device 100 and the average erase number of the memory blocks included in the memory device 100 during the use time amount.

The model manager 210 may obtain the log information for each predetermined period until the use time amount reaches a predetermined reference amount, and calculate each increment of the average erase numbers for the use time amounts of the obtained plural pieces of log information. The model manager 210 may generate a regression model that predicts the lifetime of the memory device 100 based on the average value of the increments. The model manager 210 may update the regression model based on the log information obtained after the regression model is generated. The model manager 210 may obtain the log information for the use of the memory device 100 through the self-monitoring, analysis and reporting technology (S.M.A.R.T).

According to another embodiment of the present disclosure, the log information on the use of the memory device 100 may include information on the use time amount indicating the accumulated time amount for which power is applied to the memory device 100 and the write amount indicating the accumulated amount of data on which the write operation is performed in the memory device 100 during the use time amount. The model manager 210 may obtain the log information for each predetermined period until the use time amount reaches the predetermined reference amount, and calculate each increment of the write amounts for the use time amounts of the plural pieces of log information. The model manager 210 may generate a regression model that predicts the lifetime of the memory device 100 based on the average value of the increments.

The performance manager 220 may determine a deterioration section, in which the performance of the memory device 100 is deteriorated, based on the regression model and adjust the parameter value related to the operation of the memory device 100 in the deterioration section. The performance manager 220 may include a section manager 221 and a parameter manager 223.

By using the regression model, the section manager 221 may calculate a deterioration start point, which is a use time amount corresponding to a predetermined threshold value of the average erase number, and a lifespan end point, which is a use time amount corresponding to a predetermined limit value of the average erase number. The section manager 221 may determine a section from the deterioration start point to the lifespan end point as the deterioration section.

According to another embodiment of the present disclosure, the performance manager 220 may calculate a deterioration start point, which is a use time amount corresponding to a predetermined threshold value of the write amount, and a lifespan end point, which is a use time amount corresponding to a predetermined limit value of the write amount, by using the regression model. The section manager 221 may determine a section from the deterioration start point to the lifespan end point as the deterioration section.

The parameter manager 223 may adjust parameter value (3) related to the operation of the memory device 100 in the deterioration section in response to the average erase number of the memory device 100. A parameter value related to the operation of the memory device 100 may be at least one of a parameter value that determines an internal power voltage of the memory device 100, a parameter value that determines a command processing speed of the memory device 100, and/or a parameter value that determines a read operation retry number of the memory device 100. The operation performed in the memory device 100 may be stably performed in response to the parameter value adjustment of the parameter manager 223.

When the parameter manager 223 increases the parameter value that determines the internal power voltage of the memory device 100, a magnitude of voltages generated by the voltage generator of the memory device 100 may be increased. Specifically, a magnitude of the read voltage or the program voltage generated by the voltage generator may be increased. When the parameter manager 223 increases the parameter value that determines the command processing speed of the memory device 100, the command processing speed of the memory device 100 may be decreased. The parameter value that determines the command processing speed may be a micro oscillator trimming period. When the command processing speed of the memory device 100 is decreased, a speed of a reference clock input to the memory device 100 may be decreased. When the read operation is performed in the memory device 100, a peak current of the memory device 100 may be decreased in response to the decrease of the clock speed. When the command processing speed of the memory device 100 is decreased, the read operation may be stably performed in the memory device 100. When the parameter manager 223 increases the parameter value that determines the read operation retry number of the memory device 100, the number of retries of the read operation performed in response to a failure of the read operation may be increased.

The parameter manager 223 may differently adjust the parameter value related to the operation of the memory device 100 depending on a parameter of the parameter value. The parameter manager 223 may differently determine a degree at which the parameter value is adjusted according to a type of the parameter. For example, the parameter manager 223 may increase the internal power voltage of the memory device 100 by 700% and increase read operation retry number of the memory device 100 by 450% with respect to the same average erase number as 700 times.

The deterioration section may vary depending on the parameter value related to the operation of the memory device 100. The section manager 221 may set different deterioration sections according to the parameter value adjusted by the parameter manager 223. For example, the deterioration start point of the deterioration section corresponding to the parameter value that determines the internal power voltage of the memory device 100 may be different from the deterioration start point of the deterioration section corresponding to the parameter value that determines the command processing speed of the memory device 100.

The section manager 221 may divide the deterioration section into a plurality of sub sections according to a preset ratio of the threshold value of the average erase number. A deterioration degree of the memory device 100 may correspond to the average erase number in the deterioration section. The section manager 221 may divide the deterioration section into a first sub section close to the deterioration start point and a second sub section close to the lifespan end point. The parameter manager 223 may adjust the parameter by a compensation ratio obtained by multiplying the average erase number of the memory device 100 by a predetermined value in the first sub section. The parameter manager 223 may determine the compensation ratio by assigning a weight to the average erase number of the memory device 100 and multiplying the predetermined value to the average erase number to which the weight is assigned in the second sub section. That is, in the second sub section, the parameter manager 223 may adjust the parameter value by applying a compensation ratio larger than that of the first sub section.

In another embodiment of the present disclosure, the parameter manager 223 may adjust the parameter value related to the operation of the memory device 100 in the deterioration section in response to the write amount of the memory device 100. The parameter manager 223 may adjust at least one of the parameter value that determines the internal power voltage of the memory device 100, the parameter value that determines the command processing speed of the memory device 100, and/or the parameter value that determines the read operation retry number of the memory device 100. The operation performed in the memory device 100 may be stably performed in response to the parameter value adjustment by the parameter manager 223.

Figure 7:
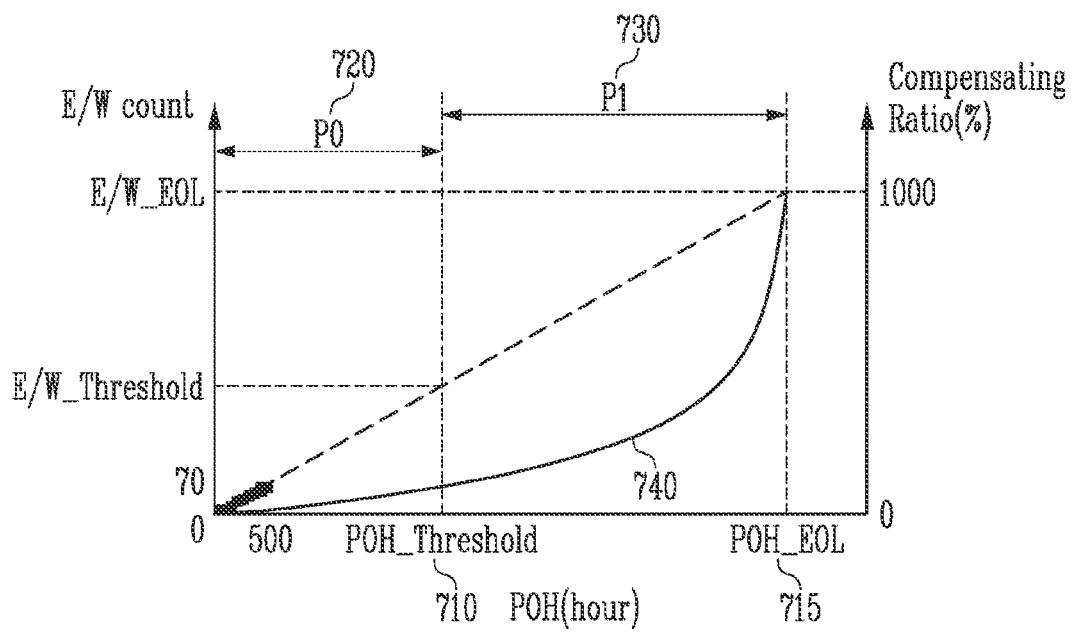
FIG. 7 is a diagram illustrating a method of determining a deterioration section based on a regression model and adjusting a parameter value related to an operation of a memory device according to still another embodiment of the present disclosure.

FIG. 7 is a diagram illustrating a method of determining a deterioration section based on a regression model and adjusting a parameter value related to an operation of a memory device according to an embodiment of the present disclosure.

Referring to FIG. 7, the regression model for predicting the use time amount for the average erase number may be described. The description of FIGS. 5 and 6 may be referred to in FIG. 7. Regarding the average erase number, a limit value E/W_EOL of the average erase number may be determined according to the memory device 100. A threshold value E/W_Threshold of the average erase number may be determined in correspondence with the limit value E/W_EOL of the average erase number. For example, when the limit value E/W_EOL of the average erase number is 1000 times, the threshold value E/W_Threshold of the average erase number may be 400 times, which is 40% of the limit value E/W_EOL of the average erase number. When the limit value E/W_EOL of the average erase number is 2000 times, the threshold value E/W_Threshold of the average erase number may be 800 times.

The model manager 210 may generate the regression model 510 shown in FIG. 5. The generated regression model 510 may be extended to the lifespan end point POH_EOL (point 715) of the memory device 100. The performance manager 220 may calculate the lifespan end point POH_EOL (point 715) corresponding to the limit value E/W_EOL of the average erase number and the deterioration start point POH_Threshold (start point 710) corresponding to the threshold value E/W_Threshold of the average erase number based on the regression model 510. The section manager 221 may determine the section from the deterioration start point POH_Threshold (start point 710) to the lifespan end point POH_EOL (end point 715) as the deterioration section P1 (duration section 730). The section manager 221 may determine the deterioration start point POH_Threshold (start point 710) as a normal section P0 (duration section 720) from 0 hour of the use time amount.

In another embodiment of the present disclosure, the deterioration section may vary depending on the parameter value related to the operation of the memory device 100. The section manager 221 may determine different deterioration sections according to the parameter value adjusted by the parameter manager 223. For example, when the limit value E/W_EOL of the average erase number is the same as 1000 times, with respect to the parameter value that determines the internal power voltage, 700 times, which is 70% of the limit value E/W_EOL of the average erase number may be the threshold value E/W_Threshold of the average erase number. With respect to the parameter value that determines the command processing speed of the memory device, 500 times, which is 50% of the limit value E/W_EOL of the average erase number, may be the threshold value E/W_Threshold of the average erase number. The section manager 221 may set a section corresponding to the average erase number having 700 to 1000 times as the deterioration section of the parameter value that determines the internal power voltage, and may determine a section corresponding to the average erase number having 500 to 1000 times as the deterioration section of the parameter value that determines the command processing speed of the memory device, respectively.

The parameter manager 223 may adjust the parameter value related to the operation of the memory device 100 in response to the average erase number corresponding to a current use time amount in the deterioration section P1 (duration section 730). The parameter manager 223 may adjust at least one of the parameter value that determines the internal power voltage of the memory device, the parameter value that determines the command processing speed of the memory device 100, or the parameter value that determines the read operation retry number of the memory device. The parameter manager 223 may not adjust the parameter value related to the operation of the memory device 100 in the normal section P0 (duration section 720).

The parameter manager 223 may determine a compensation ratio 740, which is a degree at which the parameter value is adjusted in response to the average erase number. In FIG. 7, a maximum compensation ratio corresponding to the limit value E/W_EOL of the average erase number is 1000%. Although one compensation ratio 740 is shown in FIG. 7, the compensation ratio 740 may be different according to the adjusted parameter. For example, when the parameter value that determines the internal power voltage for the same average erase number is increased by 500%, the parameter that determines the read operation retry number of the memory device may be increased by 300%. The maximum compensation ratio may also be different according to the adjusted parameter.

The compensation ratio 740 may be a degree at which the parameter value adjusted by the parameter manager 223 is adjusted. For example, when the compensation ratio is 500%, the internal power voltage of the memory device may be increased by 500%, the command processing speed of the memory device may be increased by 500%, or the read operation retry number of the memory device may be increased by 500%. The compensation ratio 740 may be increased as the use time amount of the memory device 100 approaches the lifespan end point POH_EOL (time point 715).

Figure 8:
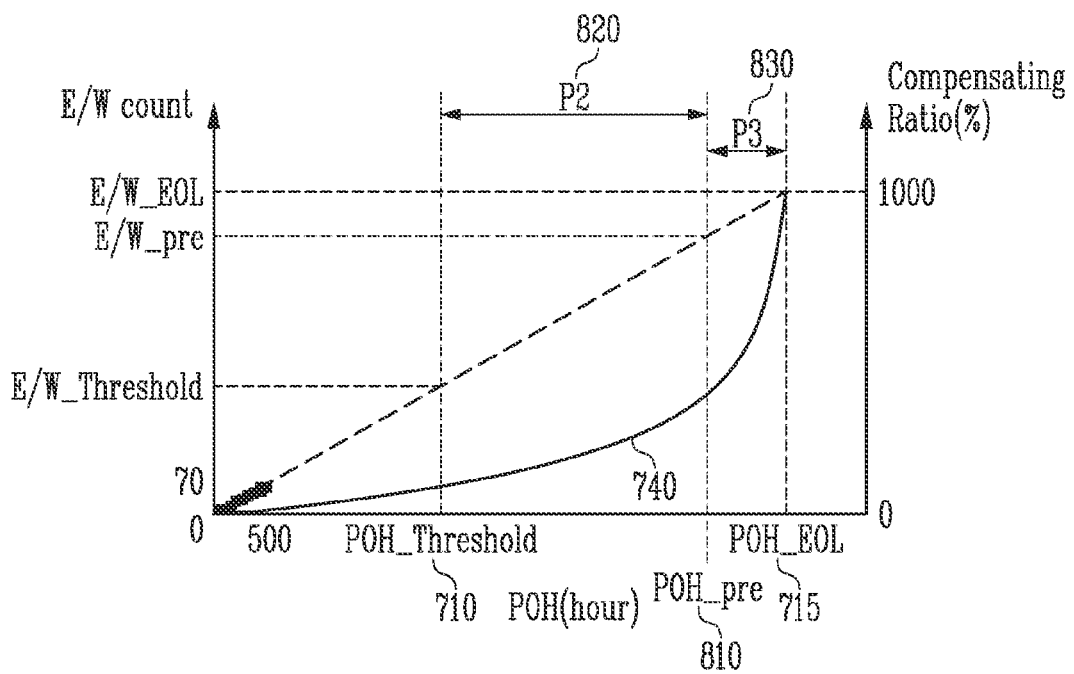
FIG. 8 is a diagram illustrating a method of dividing a deterioration section into a plurality of sub sections according to one embodiment of the present disclosure.

FIG. 8 is a diagram illustrating a method of dividing a deterioration section into a plurality of sub sections according to an embodiment of the present disclosure.

Referring to FIG. 8, the deterioration section may be divided into a first sub section P2 (duration section 820) and a second sub section P3 (duration section 830). The description of FIGS. 6 and 7 may be referred to in FIG. 8.

As the average erase number of the memory device 100 approaches the limit value E/W_EOL of the average erase number, the compensation ratio 740 determined by the parameter manager 223 may be increased rapidly in response to the deterioration of the memory device 100. The section manager 221 may determine, as the second sub section P3 (duration section 830), a section in which an increase degree of the compensation ratio 740 is large. The section manager 221 may determine, as the first sub section P2 (duration section 820), a section in which the increase degree of the compensation ratio 740 is gentle.

A boundary value E/W_pre for dividing the first sub section P2 (duration section 820) and the second sub section P3 (duration section 830) may be determined in advance based on the limit value E/W_EOL of the average erase number. For example, when the limit value E/W_EOL of the average erase number is 1000 times, 900 times, which is 90% of the limit value E/W_EOL of the average erase number, may be determined as the boundary value E/W_pre. The section manager 221 may calculate a boundary time POH_pre (time point 810) corresponding to the boundary value E/W_pre based on the regression model, and determine the first sub section P2 (duration section 820) and the second sub section P3 (duration section 830).

In FIG. 8, the deterioration section divided into the first sub section P2 (duration section 820) and the second sub section P3 (duration section 830) is shown, but the deterioration section may be divided into a plurality of sub sections. The compensation ratio 740 corresponding to each of the plurality of sub sections may be different from each other.

The boundary value E/W_pre may be determined differently according to the type of parameter controlled by the parameter manager 223. Since the boundary value E/W_pre is different according to the type of parameter, the boundary time POH_pre (time point 810) corresponding to the boundary value E/W_pre may be determined differently according to the type of parameter.

The regression model for predicting the use time amount for the write amount according to another embodiment of the present disclosure may also be used to adjust the parameter value, similar to the regression model for predicting the use time amount for the average erase number described in FIGS. 7 and 8.

Figure 9:
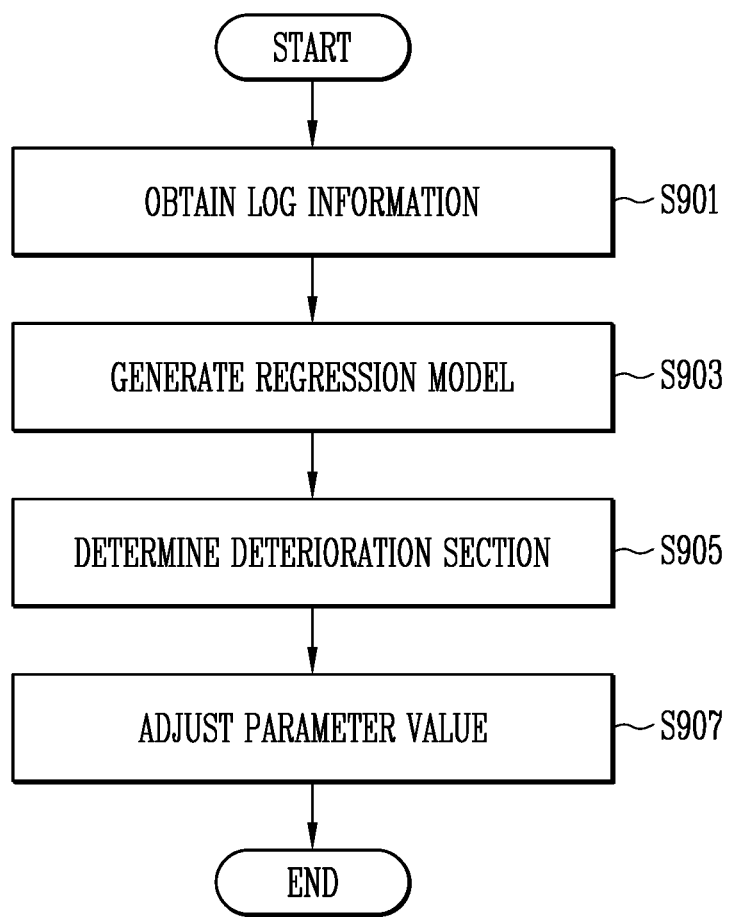
FIG. 9 is a flowchart illustrating a method of compensating for performance deterioration of a memory device according to another embodiment of the present disclosure.

FIG. 9 is a flowchart illustrating a method of compensating for performance deterioration of a memory device according to an embodiment of the present disclosure.

Referring to FIG. 9, the memory controller 200 may generate the regression model that predicts the lifespan or the performance of the memory device 100 and adjust at least one parameter related to the operation of the memory device 100 based on the regression model. Since the memory device 100 is compensated for the performance deterioration by the memory controller 200, the memory device 100 may be stably driven. An operation performed in FIG. 9 may correspond to the description of FIG. 6.

In operation S901, the model manager 210 may obtain the log information on the use of the memory device 100 for each predetermined period. The model manager 210 may obtain the plural pieces of log information until a predetermined use time amount is reached. The model manager 210 may obtain the log information on the use of the memory device 100 through the self-monitoring, analysis and reporting technology (S.M.A.R.T).

In operation S903, the model manager 210 may generate the regression model that predicts the lifespan or the performance of the memory device 100 based on the obtained plural pieces of log information. The log information on the use of the memory device 100 may include the use time amount indicating the accumulated time amount for which power is applied to the memory device 100 and the average erase number of the memory blocks included in the memory device 100 during the use time amount. The model manager 210 may calculate each increment of the average erase numbers for the use time amounts of the plural pieces of log information, and generate the regression model based on the average value of the increments. The lifespan or the performance of the memory device 100 predicted by the regression model may be different according to the log information on the use of the memory device 100.

In operation S905, the performance manager 220 may determine the deterioration section in which the performance of the memory device 100 is deteriorated based on the regression model. Based on the regression model, the deterioration start point, which is the use time amount corresponding to the predetermined threshold value of the average erase number, and the lifespan end point, which is the use time amount corresponding to the predetermined limit value of the average erase number, may be calculated. The performance manager 220 may determine the section from the deterioration start point to the lifespan end point as the deterioration section. The section manager 221 may determine each deterioration section according to the type of the adjusted parameter. The section manager 221 may divide the deterioration section into the plurality of sub sections.

In operation S907, the performance manager 220 may adjust the parameter value related to the operation of the memory device 100 in the deterioration section. The performance manager 220 may adjust the parameter value of the memory device 100 according to the compensation ratio. The compensation ratio may be different according to the type of adjusted parameter.

Figure 10:
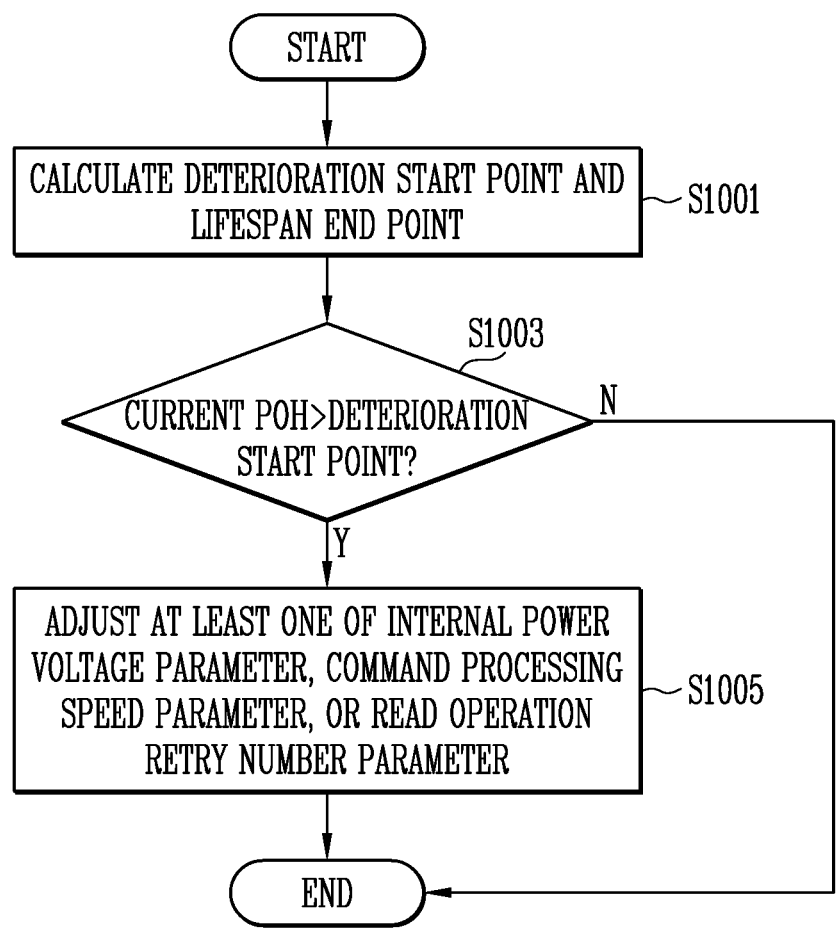
FIG. 10 is a flowchart illustrating a method of adjusting a parameter value related to an operation of a memory device according to still another embodiment of the present disclosure.

FIG. 10 is a flowchart illustrating a method of adjusting a parameter value related to an operation of a memory device according to one embodiment of the present disclosure.

Referring to FIG. 10, the performance manager 220 may determine the deterioration section and adjust the parameter of the memory device 100. An operation performed in FIG. 10 may correspond to the description of FIGS. 6 to 8.

In operation S1001, the section manager 221 may calculate the deterioration start point and the lifespan end point of the memory device 100. The section manager 221 may calculate the deterioration start point, which is the use time amount corresponding to the predetermined threshold value of the average erase number, and the lifespan end point, which is the use time amount corresponding to the predetermined limit value of the average erase number, by using the regression model. The section manager 221 may determine the section from the deterioration start point to the lifespan end point as the deterioration section.

In operation S1003, the parameter manager 223 may compare the current use time amount and the deterioration start point. When the current use time amount is less than the deterioration start point, the parameter value of the memory device 100 may not be adjusted and thus the operation may be ended. When the current use time amount is greater than the deterioration start point, the parameter manager 223 may adjust the parameter value of the memory device 100.

In operation S1005, the parameter manager 223 may adjust at least one of the parameter value that determines the internal power voltage of the memory device, the parameter value that determines the command processing speed of the memory device, and/or the parameter value that determines the read operation retry number of the memory device. The parameter manager 223 may determine the compensation ratio, which is a degree at which the parameter value is adjusted in response to the average erase number corresponding to the current use time amount. The parameter manager 223 may adjust the parameter of the memory device 100 according to the determined compensation ratio. The parameter manager 223 may differently determine the compensation ratio according to the type of the adjusted parameter.

Figure 11:
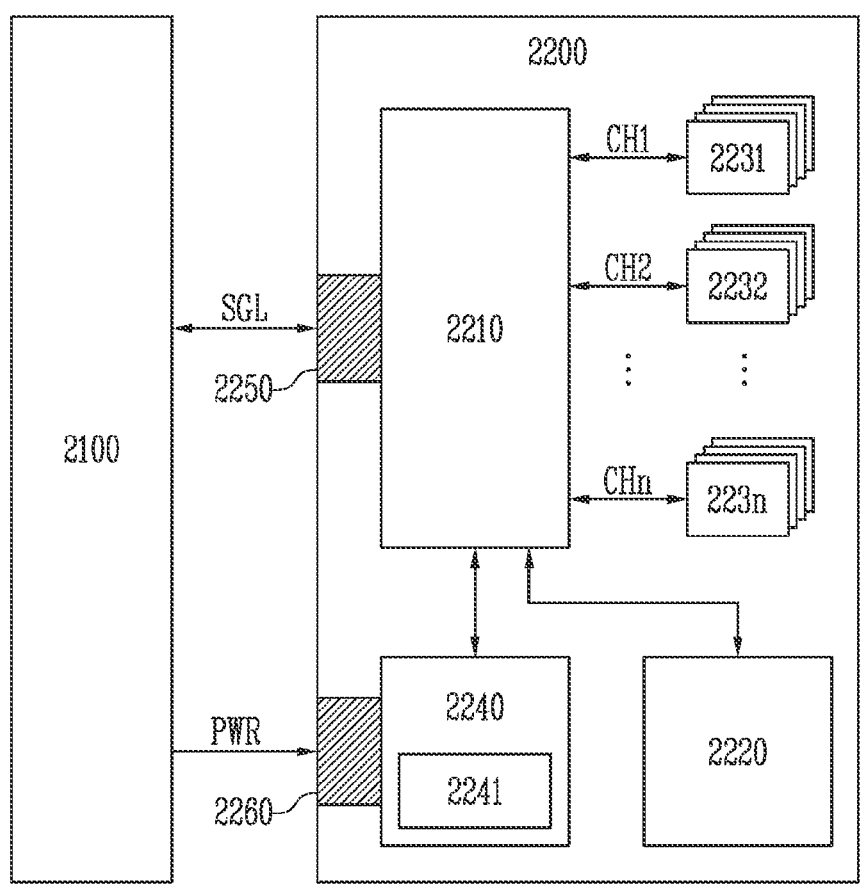
FIG. 11 is a diagram exemplarily illustrating a data processing system including a solid state drive according to one embodiment of the present disclosure.

FIG. 11 is a diagram exemplarily illustrating a data processing system 2000 including a solid state drive (SSD) according to one embodiment of the present disclosure. Referring to FIG. 11, the data processing system 2000 may include a host device 2100 and an SSD 2200.

The SSD 2200 may include a controller 2210, a buffer memory device 2220, nonvolatile memories 2231 to 223*n*, a power supply 2240, a signal connector 2250, and a power connector 2260.

The controller 2210 may control an overall operation of the SSD 2200.

The buffer memory device 2220 may temporarily store data to be stored in the nonvolatile memories 2231 to 223*n*. In addition, the buffer memory device 2220 may temporarily store data read from the nonvolatile memories 2231 to 223*n*. The data temporarily stored in the buffer memory device 2220 may be transmitted to the host device 2100 or the nonvolatile memories 2231 to 223*n* under control of the controller 2210.

The nonvolatile memories 2231 to 223*n* may be used as a storage medium of the SSD 2200. Each of the nonvolatile memories 2231 to 223*n* may be connected to the controller 2210 through a plurality of channels CH1 to CHn. One or more nonvolatile memories may be connected to one channel. The nonvolatile memories connected to one channel may be connected to the same signal bus and data bus.

The power supply 2240 may provide power PWR input through the power connector 2260 into the SSD 2200. The power supply 2240 may include an auxiliary power supply 2241. The auxiliary power supply 2241 may supply power so that the SSD 2200 is normally ended when a sudden power off occurs. The auxiliary power supply 2241 may include large capacity capacitors capable of charging the power PWR.

The controller 2210 may exchange a signal SGL with the host device 2100 through the signal connector 2250. Here, the signal SGL may include a command, an address, data, and the like. The signal connector 2250 may be configured as various types of connectors according to an interface method between the host device 2100 and the SSD 2200.

Figure 12:
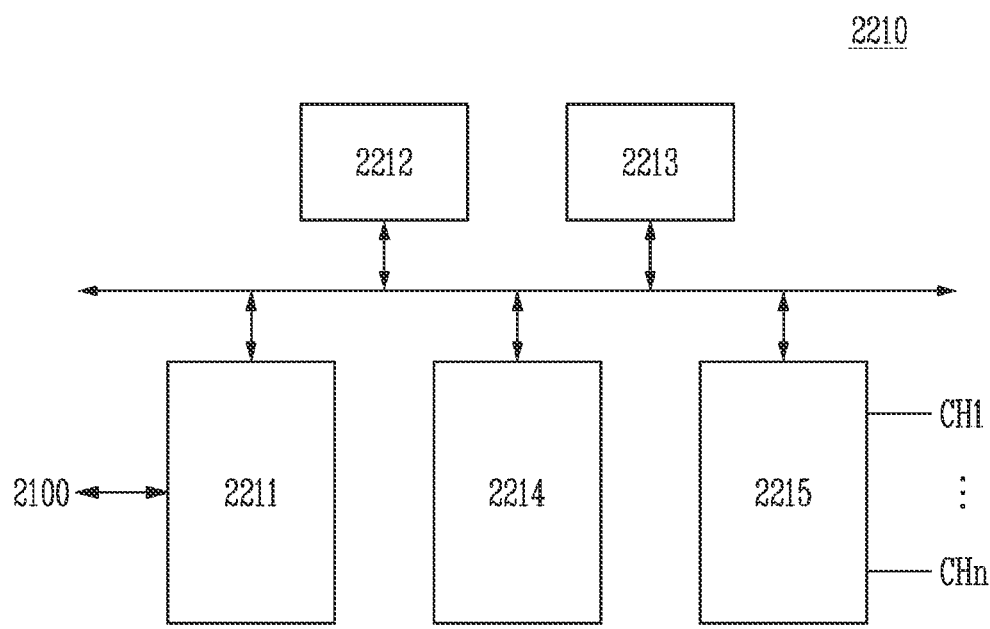
FIG. 12 is a diagram exemplarily illustrating a configuration of the controller of FIG. 11.

FIG. 12 is a diagram exemplarily illustrating a configuration of the controller 2210 of FIG. 11. Referring to FIG. 12, the controller 2210 may include a host interface unit 2211, a control unit 2212, a random access memory 2213, an error correction code (ECC) unit 2214, and a memory interface unit 2215.

The host interface unit 2211 may interface the host device 2100 and the SSD 2200 according to a protocol of the host device 2100. For example, the host interface unit 2211 may communicate with the host device 2100 through any one of various communication standards or interfaces such as secure digital, universal serial bus (USB), multi-media card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI Express (PCI-e or PCIe), and universal flash storage (UFS) protocols. In addition, the host interface unit 2211 may perform a disk emulation function that supports the host device 2100 to recognize the SSD 2200 as a general-purpose data storage device, for example, a hard disk drive (HDD).

The control unit 2212 may analyze and process the signal SGL input from the host device 2100. The control unit 2212 may control an operation of internal functional blocks according to instructions such as for example firmware or software for driving the SSD 2200. The random access memory 2213 may be used as an operation memory for driving such firmware or software.

The ECC unit 2214 may generate parity data of data to be transmitted to the nonvolatile memories 2231 to 223n. The generated parity data may be stored in the nonvolatile memories 2231 to 223n together with the data. The ECC unit 2214 may detect an error of data read from the nonvolatile memories 2231 to 223n based on the parity data. When the detected error is within a correctable range, the ECC unit 2214 may correct the detected error.

The memory interface unit 2215 may provide a control signal such as a command and an address to the nonvolatile memories 2231 to 223n under control of the control unit 2212. In addition, the memory interface unit 2215 may exchange data with the nonvolatile memories 2231 to 223n under the control of the control unit 2212. For example, the memory interface unit 2215 may provide the data stored in the buffer memory device 2220 to the nonvolatile memories 2231 to 223n, or provide the data read from the nonvolatile memories 2231 to 223n to the buffer memory device 2220.

Figure 13:
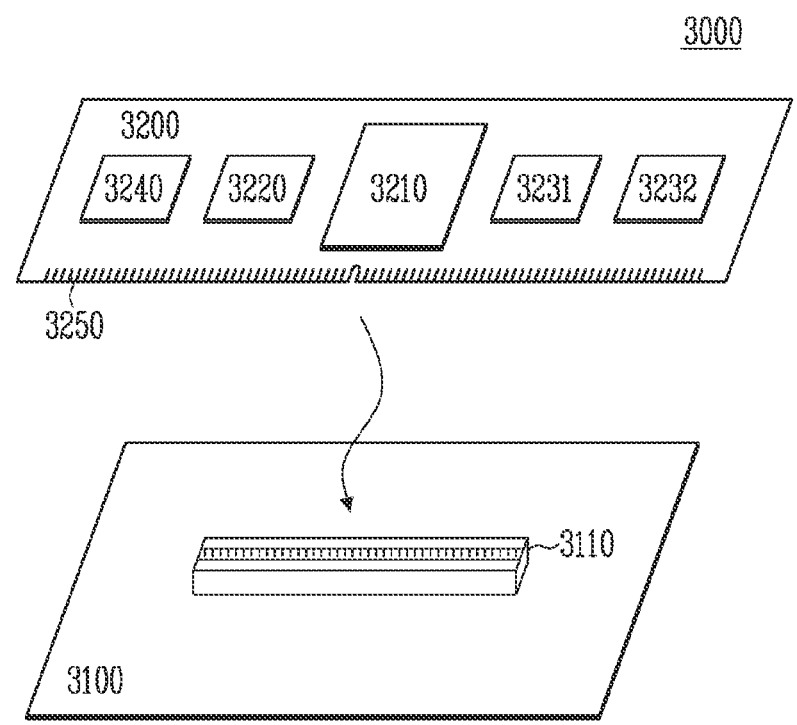
FIG. 13 is a diagram exemplarily illustrating a data processing system including a data storage device according to another embodiment of the present disclosure.

FIG. 13 is a diagram exemplarily illustrating a data processing system 3000 including a data storage device according to one embodiment of the present disclosure. Referring to FIG. 13, the data processing system 3000 may include a host device 3100 and a data storage device 3200.

The host device 3100 may be configured in a form of a board such as a printed circuit board. The host device 3100 may include internal functional blocks for performing a function of the host device.

The host device 3100 may include a connection terminal 3110 such as a socket, a slot, or a connector. The data storage device 3200 may be mounted on the connection terminal 3110.

The data storage device 3200 may be configured in a form of a board such as a printed circuit board. The data storage device 3200 may be referred to as a memory module or a memory card. The data storage device 3200 may include a controller 3210, a buffer memory device 3220, nonvolatile memories 3231 to 3232, a power management integrated circuit (PMIC) 3240, and a connection terminal 3250.

The controller 3210 may control an overall operation of the data storage device 3200. The controller 3210 may be configured identically to the controller 2210 shown in FIG. 11.

The buffer memory device 3220 may temporarily store data to be stored in the nonvolatile memories 3231 to 3232. In addition, the buffer memory device 3220 may temporarily store data read from the nonvolatile memories 3231 to 3232. The data temporarily stored in the buffer memory device 3220 may be transmitted to the host device 3100 or the nonvolatile memories 3231 to 3232 under control of the controller 3210.

The nonvolatile memories 3231 to 3232 may be used as a storage medium of the data storage device 3200.

The PMIC 3240 may provide power input through the connection terminal 3250 into the data storage device 3200. The PMIC 3240 may manage the power of the data storage device 3200 according to the control of the controller 3210.

The connection terminal 3250 may be connected to the connection terminal 3110 of the host device. Power and a signal such as a command, an address, and data may be transmitted between the host device 3100 and the data storage device 3200 through the connection terminal 3250. The connection terminal 3250 may be configured as various types according to an interface method between the host device 3100 and the data storage device 3200. The connection terminal 3250 may be disposed on any one side of the data storage device 3200.

Figure 14:
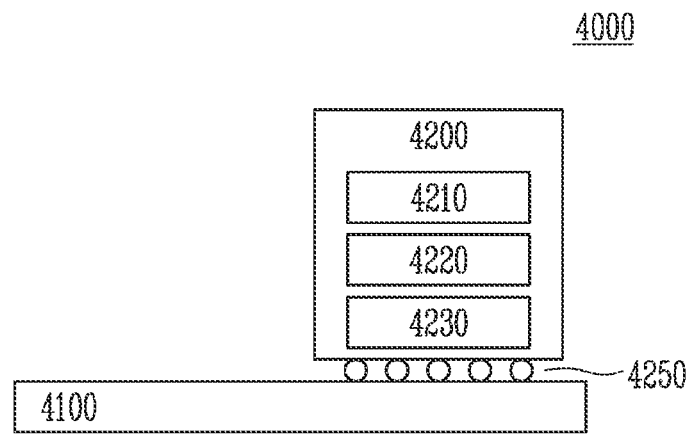
FIG. 14 is a diagram exemplarily illustrating a data processing system including a data storage device according to still another embodiment of the present disclosure.

FIG. 14 is a diagram exemplarily illustrating a data processing system 4000 including a data storage device according to an embodiment of the present disclosure. Referring to FIG. 14, the data processing system 4000 may include a host device 4100 and a data storage device 4200.

The host device 4100 may be configured in a form of a board such as a printed circuit board. The host device 4100 may include internal functional blocks for performing a function of the host device.

The data storage device 4200 may be configured in a form of a surface mounted package. The data storage device 4200 may be mounted on the host device 4100 through a solder ball connection 4250. The data storage device 4200 may include a controller 4210, a buffer memory device 4220, and a nonvolatile memory 4230.

The controller 4210 may control an overall operation of the data storage device 4200. The controller 4210 may be configured identically to the controller 2210 shown in FIG. 11.

The buffer memory device 4220 may temporarily store data to be stored in the nonvolatile memory 4230. In addition, the buffer memory device 4220 may temporarily store data read from the nonvolatile memories 4230. The data temporarily stored in the buffer memory device 4220 may be transmitted to the host device 4100 or the nonvolatile memory 4230 under control of the controller 4210.

The nonvolatile memory 4230 may be used as a storage medium of the data storage device 4200.

Figure 15:
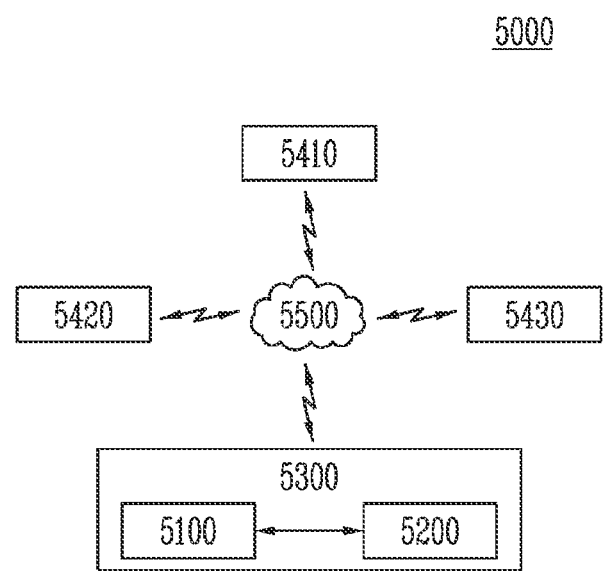
FIG. 15 is a diagram exemplarily illustrating a network system including a data storage device according to yet another embodiment of the present disclosure.

FIG. 15 is a diagram exemplarily illustrating a network system 5000 including a data storage device according to one embodiment of the present disclosure. Referring to FIG. 15, the network system 5000 may include a server system 5300 and a plurality of client systems 5410 to 5430 connected through a network 5500.

The server system 5300 may service data in response to a request of the plurality of client systems 5410 to 5430. For example, the server system 5300 may store data provided from the plurality of client systems 5410 to 5430. As another example, the server system 5300 may provide data to the plurality of client systems 5410 to 5430.

The server system 5300 may include a host device 5100 and a data storage device 5200. The data storage device 5200 may include the memory system 50 of FIG. 1, the SSD 2200 of FIG. 11, the data storage device 3200 of FIG. 13, and the data storage device 4200 of FIG. 14.

According to one embodiment of the present disclosure, since the regression model is generated based on the log information on the use of a memory device, reliability of a lifespan end point of the memory device predicted by the regression model may be secured. The pattern in which the user uses the memory device may be reflected in the log information. The regression model generated based on the log information of the user who frequently performs an operation of storing and erasing data in the memory device and the regression model generated based on the log information of the user who mainly performs the read operation may be different from each other, and a lifetime of the device may also be different.

According to one embodiment of the present disclosure, since a parameter related to the operation of the memory device is adjusted according to the deterioration of the memory device, the memory device may be stably operated. Since the memory device may be stably operated, the memory device may operate normally even though the lifespan end point is exceeded. The same effect as that of the lifespan of the memory device being extended may be obtained by adjusting a parameter related to the operation of the memory device.

Since the present disclosure may be implemented in other specific forms without changing the technical spirit or essential features thereof, those of ordinary skill in the art to which the present disclosure pertains should understand that the embodiments described above are illustrative and are not limited in all aspects. The scope of the present disclosure is indicated by the claims to be described later rather than the detailed description, and all changes or modifications derived from the meaning and scope of the claims and their equivalent concepts are interpreted as being included in the scope of the present disclosure in addition to the embodiments disclosed herein and the following claims. Furthermore, the embodiments may be combined to form additional embodiments.

What is claimed is:

1. A memory controller that controls a memory device, the memory controller comprising:

a model manager configured to obtain log information on use of the memory device for a predetermined period, and generate a regression model that predicts a lifespan of the memory device based on the log information; and a performance manager configured to determine a deterioration section, in which performance of the memory device is deteriorated, based on the regression model and adjust a parameter value related to an operation of the memory device in the deterioration section, wherein the log information includes a use time amount indicating an accumulated time amount for which power is applied to the memory device and an average erase number of memory blocks included in the memory device during the use time amount, and wherein the model manager:

obtains the log information for the predetermined period until the use time amount reaches a predetermined reference amount, calculates increments of the average erase number for the use time amount of each of obtained plural pieces of log information, and generates the regression model based on an average value of the increments.

2. The memory controller of claim 1, wherein the performance manager includes a section manager configured to:

calculate, by using the regression model, a deterioration start point, which is the use time amount corresponding to a predetermined threshold value of the average erase number, and a lifespan end point, which is a use time amount corresponding to a predetermined limit value of the average erase number, and determine a section from the deterioration start point to the lifespan end point as the deterioration section.

3. The memory controller of claim 2, wherein the performance manager further includes a parameter manager configured to adjust the parameter value related to the operation of the memory device in response to the average erase number, and wherein the parameter value related to the operation of the memory device is at least one of a parameter value for determining an internal power voltage of the memory device, a parameter value for determining a command processing speed of the memory device, and a parameter value for determining a read operation retry number of the memory device.

4. The memory controller of claim 3, wherein the deterioration section varies depending on the parameter value related to the operation of the memory device.

5. The memory controller of claim 3, wherein the parameter manager differently adjusts the parameter value related to the operation of the memory device depending on a parameter of the parameter value.

6. The memory controller of claim 3, wherein the section manager is further configured to divide the deterioration section into a plurality of sub sections according to at least a preset ratio of the limit value.

7. The memory controller of claim 6, wherein the parameter manager differently adjusts the parameter value related to the operation of the memory device for each of the plurality of sub sections.

8. The memory controller of claim 1, wherein the model manager is further configured to update the regression model based on log information obtained after the regression model is generated.

9. The memory controller of claim 1, wherein the model manager obtains the log information by using a self-monitoring, analysis, and reporting technology for the memory device.

10. A memory system comprising:
a memory device; and
a memory controller that controls the memory device,
wherein the memory controller comprises:
a model manager configured to generate a regression model that predicts performance of the memory device based on log information on use of the memory device; and
a performance manager configured to determine a deterioration section, in which the performance of the memory device is deteriorated, based on the regression model and adjust a parameter value related to an operation of the memory device in the deterioration section,
wherein the log information includes information on a use time amount indicating an accumulated time amount for which power is applied to the memory device and a write amount indicating an amount of data on which a write operation is performed in the memory device during the use time amount, and
wherein the model manager:
obtains the log information for a predetermined period until the use time amount reaches a predetermined reference amount,
calculates increments of the write amount for the use time amount of each of obtained plural pieces of log information, and
generates the regression model based on an average value of the increments.

11. The memory system of claim 10, wherein the performance manager includes a section manager configured to:
calculate, by using the regression model, a deterioration start point, which is the use time amount corresponding to a predetermined threshold value of the write amount, and a lifespan end point, which is the use time amount corresponding to a predetermined limit value of the write amount, and
determine a section from the deterioration start point to the lifespan end point as the deterioration section.

12. The memory system of claim 11,
wherein the performance manager further includes a parameter manager configured to adjust the parameter value related to the operation of the memory device in response to the write amount, and
wherein the parameter value related to the operation of the memory device is at least one of a parameter value for determining an internal power voltage of the memory device, a parameter value for determining a command processing speed of the memory device, and a parameter value for determining a read operation retry number of the memory device.

13. A method of operating a memory controller that controls a memory device, the method comprising:
obtaining log information on use of the memory device for a predetermined period;
calculating increments of an average erase number for a use time amount of each of obtained plural pieces of log information;
generating a regression model that predicts a lifespan of the memory device based on the log information;
determining a deterioration section, in which performance of the memory device is deteriorated, based on the regression model; and
adjusting a parameter value related to an operation of the memory device in the deterioration section,
wherein the log information includes the use time amount indicating an accumulated time amount for which power is applied to the memory device and the average erase number of memory blocks included in the memory device during the use time amount,
wherein the log information is obtained for the predetermined period until the use time amount reaches a predetermined reference amount, and
wherein the regression model is generated based on an average value of the increments.

14. The method of claim 13, wherein the determining of the deterioration section comprises:
calculating, by using the regression model, a deterioration start point, which is the use time amount corresponding to a predetermined threshold value of the average erase number, and a lifespan end point, which is the use time amount corresponding to a predetermined limit value of the average erase number; and
determining a section from the deterioration start point to the lifespan end point as the deterioration section.

15. The method of claim 14, wherein the adjusting of the parameter value comprises adjusting, in response to the average erase number, at least one of a parameter value for determining an internal power voltage of the memory device, a parameter value for determining a command processing speed of the memory device, and a parameter value for determining a read operation retry number of the memory device.

16. The method of claim 13, further comprising updating the regression model based on log information obtained after the regression model is generated.

17. The method of claim 13, wherein the obtaining of the log information comprises obtaining information on the use time amount and the average erase number by using a self-monitoring, analysis, and reporting technology for the memory device.

* * * * *